United States Patent
Torreiter et al.

(10) Patent No.: US 9,322,848 B2
(45) Date of Patent: Apr. 26, 2016

(54) BALL GRID ARRAY CONFIGURATION FOR RELIABLE TESTING

(71) Applicant: GLOBALFOUNDRIES INC., Grand Cayman (KY)

(72) Inventors: Otto A. Torreiter, Leinfelden-Echterdingen (DE); Dieter Wendel, Schoenaich (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 104 days.

(21) Appl. No.: 13/934,453

(22) Filed: Jul. 3, 2013

(65) Prior Publication Data

US 2015/0008949 A1 Jan. 8, 2015

(51) Int. Cl.
*G01R 31/02* (2006.01)
*G01R 1/073* (2006.01)
*G01R 31/26* (2014.01)

(52) U.S. Cl.
CPC ............ *G01R 1/073* (2013.01); *G01R 31/2601* (2013.01)

(58) Field of Classification Search
None
See application file for complete search history.

(56) References Cited

U.S. PATENT DOCUMENTS

| | | | |
|---|---|---|---|
| 6,365,978 B1 * | 4/2002 | Ibnabdeljalil et al. | 257/786 |
| 6,861,762 B1 | 3/2005 | Rotem | |
| 7,064,445 B2 * | 6/2006 | Yu et al. | 257/778 |
| 8,237,274 B1 * | 8/2012 | Rahman | 257/737 |
| 8,264,249 B2 | 9/2012 | Lee et al. | |
| 8,322,020 B2 | 12/2012 | Hsu et al. | |
| 2012/0018874 A1 | 1/2012 | Lin et al. | |
| 2012/0104599 A1 | 5/2012 | Do et al. | |
| 2012/0248604 A1 | 10/2012 | Daubenspeck et al. | |
| 2015/0008947 A1 | 1/2015 | Torreiter et al. | |

OTHER PUBLICATIONS

Dang, et al., "3D Chip Stacking with 50 um Pitch Lead-Free Micro-C4 Interconnections", 2011 Electronic Components and Technology Conference, © 2011 IEEE, May 31, 2011-Jun. 3, 2011, pp. 268-273. <http://ieeexplore.ieee.org/xpl/login.jsp?tp=&arnumber=5898524 &url=http://ieeexplore.ieee.org/xpls/abs_all.jsp?arnumber=5898524>.

Moon, S. "Pad-to-pad isolation of vertical interconnects using magnetically aligned anisotropic conductive adhesive", Article first published online: Aug. 24, 2012, DOI: 10.1002/mop.27153, Copyright © 2012 Wiley Periodicals, Inc., <http://onlinelibrary.wiley.com/doi/10.1002/mop.27153/abstract;jsessionid=8844625FA0EB3E70DCDAE8AB4F8C7A68.d02t04?deniedAccessCustomisedMessage=&userIsAuthenticated=false>.

Wang, et al., "MEMS Vertical Probe Cards With Ultra Densely Arrayed Metal Probes for Wafer-Level IC Testing", Journal of Microelectromechanical Systems, vol. 18, No. 4, Aug. 2009, DOI: 10.1109/JMEMS.2009.2021815, © 2009 IEEE, pp. 933-941, <http://ieeexplore.ieee.org/xpl/login.jsp?tp=&arnumber=5075645 &url=http://ieeexplore.ieee.org/xpls/abs_all.jsp?arnumber=5075645>.

* cited by examiner

*Primary Examiner* — Minh N Tang
(74) *Attorney, Agent, or Firm* — DeLio, Peterson & Curcio, LLC; Kelly M. Nowak

(57) ABSTRACT

A semiconductor die with an array of contacts, where at least two contacts in adjacent positions have the same data signal during testing operations with a test probe. The adjacent contacts of the cluster allow the use of a larger test probe tip and/or greater tolerance on test probe tip alignment during testing operations.

7 Claims, 5 Drawing Sheets

BALL GRID ARRAY CONFIGURATION FOR RELIABLE TESTING

FIELD OF THE INVENTION

The present invention relates generally to the field of semiconductor dies, and more particularly to testing semiconductor dies having high density C4 (controlled collapse chip connection) array grids.

BACKGROUND OF THE INVENTION

C4 arrays are conventionally tested with probe devices. The probe devices have multiple probe tips that respectively make electrical contact with the ball structures (or, more generically, input/output (I/O) pads of the C4 array). Each probe tip of the probe is mutually electrically isolated so that power or signals conducted to one tip will not affect readings from the other tips. The I/O pads of a semiconductor die are usually arranged as an array, such as an array of one of the following types: (i) regular rectangular array; and (ii) staggered array (see Definition, below). As will be appreciated from the definition of "staggered array", in a staggered array (i) the objects of alternating columns have objects in the same aligned rows of the staggered array, but (ii) the objects of adjacent column are offset from each other into different rows of the staggered array.

It is known that the I/O pads of an array are respectively characterized by different I/O pad types, such as power supply pad, ground pad, and data signal pad. For a given die: (i) power supply type pads may have different respective power levels (for example, C1 level and V2 level); and (ii) data signal type pads will generally each have a different particular data signal. Generally, each I/O pad that is contacted by a probe tip will only be contacted by one probe tip. It is known that a single probe tip cannot, without risk of damage and/or bad test data, touch both of the following at the same time: (i) a pad having a first data signal; and (ii) a pad of any other type or a pad having a data signal other than the first data signal. Because of this important restriction, conventional probe tips are structured and controlled to touch no more than one pad at the same time, and are carefully controlled in operation to touch no more than one pad at a time. Advances in wafer testing of high pin count chips includes: (i) the reduced pin count test, where only a subset of so-called test pins, or data signal type pads, are required to be connected during the wafer test application. The design for testing the chip addresses the high I/O pad coverage by not contacting all data signal type pads.

The probe devices used in wafer testing, also referred to as beta testing, and subsequent integrated circuit (IC) testing are generally configured as probe cards containing multiple microscopic probes. It is the alignment of these microscopic probes (that is, the registration between the I/O contact pads on the wafer and the probe tips) that ensures contact with the correct I/O pad types as the pads and the tips are relatively moved into an electrically connecting (that is, contacting) position.

It is understood that potential testing problems include the following: (i) losing electrical contact with the high density C4, or flip chip; (ii) electrical shorting, by a probe tip, between two data signal pads that have different data signal; and/or (iii) electrical shorting, by a probe tip, between a data signal pad and another pad that is of the ground type or the power type.

SUMMARY

Embodiments of the present invention disclose a semiconductor die including a substrate, and a plurality of contacts arranged in a first array. The plurality of contacts includes a first contact and a second contact. The first contact and the second contact are adjacent. The first contact and the second contact are structured and/or electrically connected to have an identical data signal at least during testing operations.

DETAILED DESCRIPTION

It is recognized by the present invention that C4 array (or grid) density may, in some cases, be limited by potential testing problems, as discussed above in the Background section. Factors for missing electrical contact in higher density grids include: (i) tolerances in C4 ball size; (ii) probe tip size; and (iii) alignment tolerance of the probing equipment used (such as automatic wafer probers). Some embodiments of the present invention may have one or more of the following features, characteristics and/or advantages: (i) increased grid density; and/or (ii) reduce or eliminate electrical short problems during testing.

Figure 1:
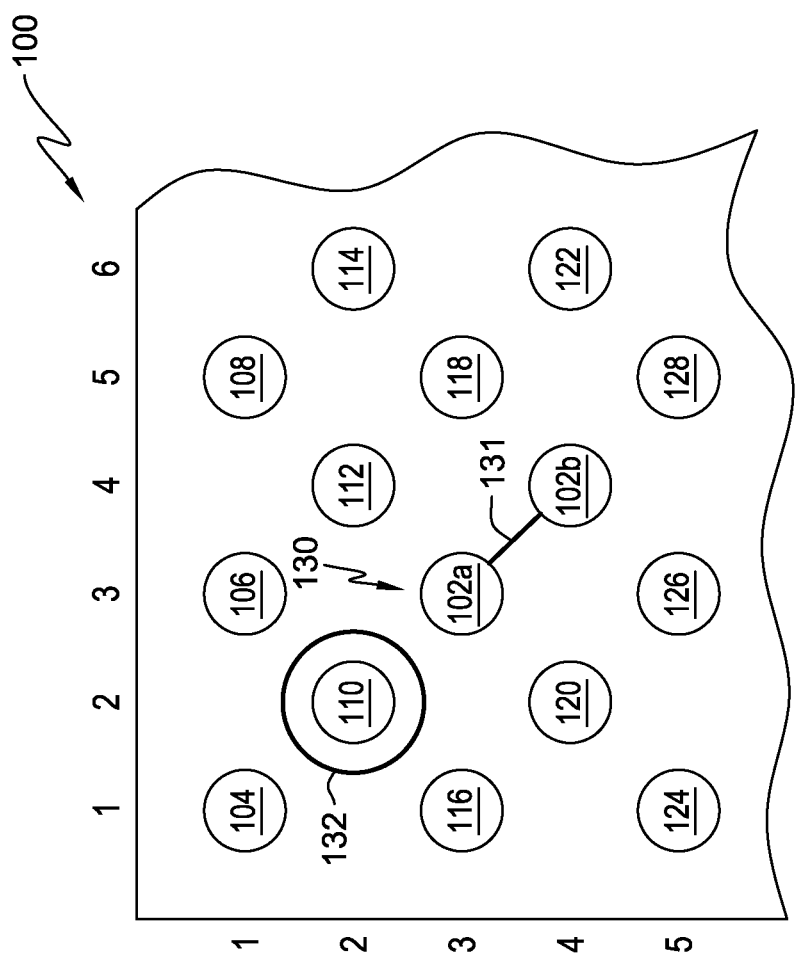
FIG. 1 is a partial plan view of a first semiconductor die layout according to the present invention.

FIG. 1 depicts a staggered array 100 of I/O pads according to an embodiment of the present invention. Staggered array 100 includes: first data signal pads 102a and 102b; other I/O pads 104, 106, 108, 110, 112, 114, 116, 118, 120, 122, 124, 126 and 128; test cluster 130; probe tip outline 132; and current path member 131.

First data signal pads 102a and 102b are electrically connected (see definition, below) to each other by member 131, which is located in the body of the semiconductor die (no separate reference numeral). Because pads 102a and 102b are electrically connected to each other: (i) they will carry and communicate the same data signal during testing operations; and (ii) they form a "test cluster" called test cluster 130. A test cluster is a separately testable signal made up of a set of two or more I/O pads having the same data signal during testing operations. Unlike conventional data signal type pads (which generally all carry different data signals), a test probe tip can safely touch both of pads 102a and 102b at the same time, without compromising the test results or causing any other problems. While this embodiment uses a small, straight line member to electrically connect the pads of its cluster, the pads of a cluster may be connected and/or structured to have the same signal without such a direct electrical connection between them.

In order to form a "test cluster," the constituent I/O pads must: (i) carry the same data signal during testing operations; and (ii) be "adjacent" (see definition below) to at least one other pad in the cluster. The two I/O pads in test cluster 130 are in both a consecutive row and a consecutive column of the staggered array of FIG. 1, meaning that pads 102*a* and 102*b* are mutually "adjacent" within the definition of that term as set forth below.

Functional defects of test cluster 130 are tested by a probe tip making contact with one or both of test contacts 102 during testing. This arrangement provides for: (i) redundancy of contact; and (ii) greater available alignment tolerance in probe tip placement. For example, probe tip outline 132 is shown as centrally located on pad 110, and it can be seen how far misaligned this tip could be before it comes into contact with a pad having a different signal, such as pad 104 or 106 or 116 or 102*a*. More specifically, in this example, a misalignment of less than the pad radius could cause a problematic short. On the other hand, if the same probe tip is nominally centered on the center point of member 131, then a misalignment that small would not cause a short. In many embodiments, the use of test clusters can allow for greater probe tip misalignments than is conventionally possible using the same grid and probe tip geometries.

Figure 7B:
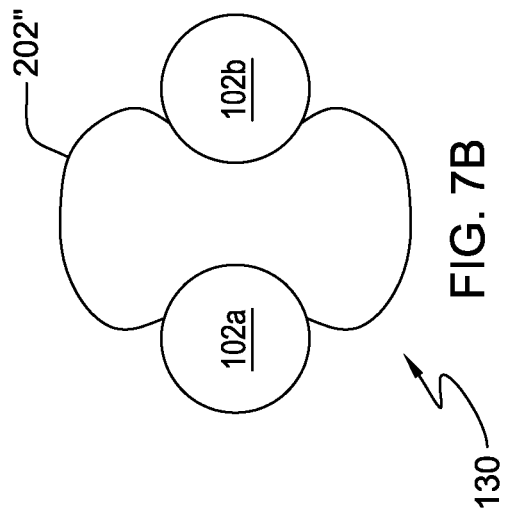
FIG. 7A and 7B are views of a fourth semiconductor die layout and a fifth probe tip configuration according to the present invention.
Figure 7A:
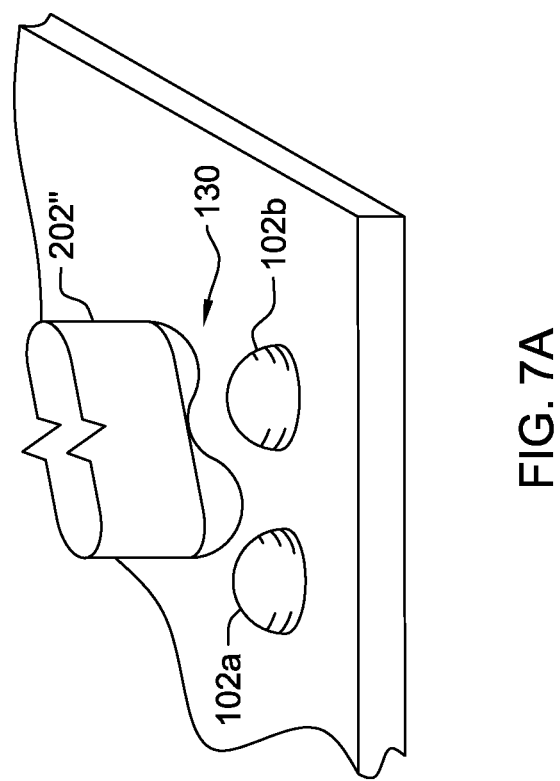

In an alternative configuration, the probe tip designed to make contact with test cluster 130 may have an elongated cross-section extending from one I/O pad to the other, while maintaining the same cross-sectional area as the circular probe tip, to provide even more alignment tolerance in some directions. Another configuration, described in more detail with reference to FIGS. 7A and 7B, below, is configured to be self-centering between the two electrically common I/O pads.

Larger clusters of I/O pads can provide further resistance to misalignment issues by facilitating one or more of the following: (i) larger probe tip designs (allowing for stronger probe structures); (ii) increased alignment tolerance for the same size and/or shape of probe tip; and (iii) increased self-centering support where probe tips make tangential contact with the I/O ball structures (again, this will be discussed, below, in connection with FIGS. 7A and 7B). Examples of an I/O pad cluster, or test cluster, configurations include: (i) two pad clusters; (ii) three pad clusters; (iii) four pad clusters; and/or (iv) larger clusters. For some applications, four pad clusters are preferred.

In some embodiments of the present invention, I/O pads are positioned so that, for each data signal pad selected for testing, a test cluster of the same data signal ID is located for probe testing such that no I/O pads of any other types or IDs are positioned in-between the selected data signal type pads.

Figure 2:
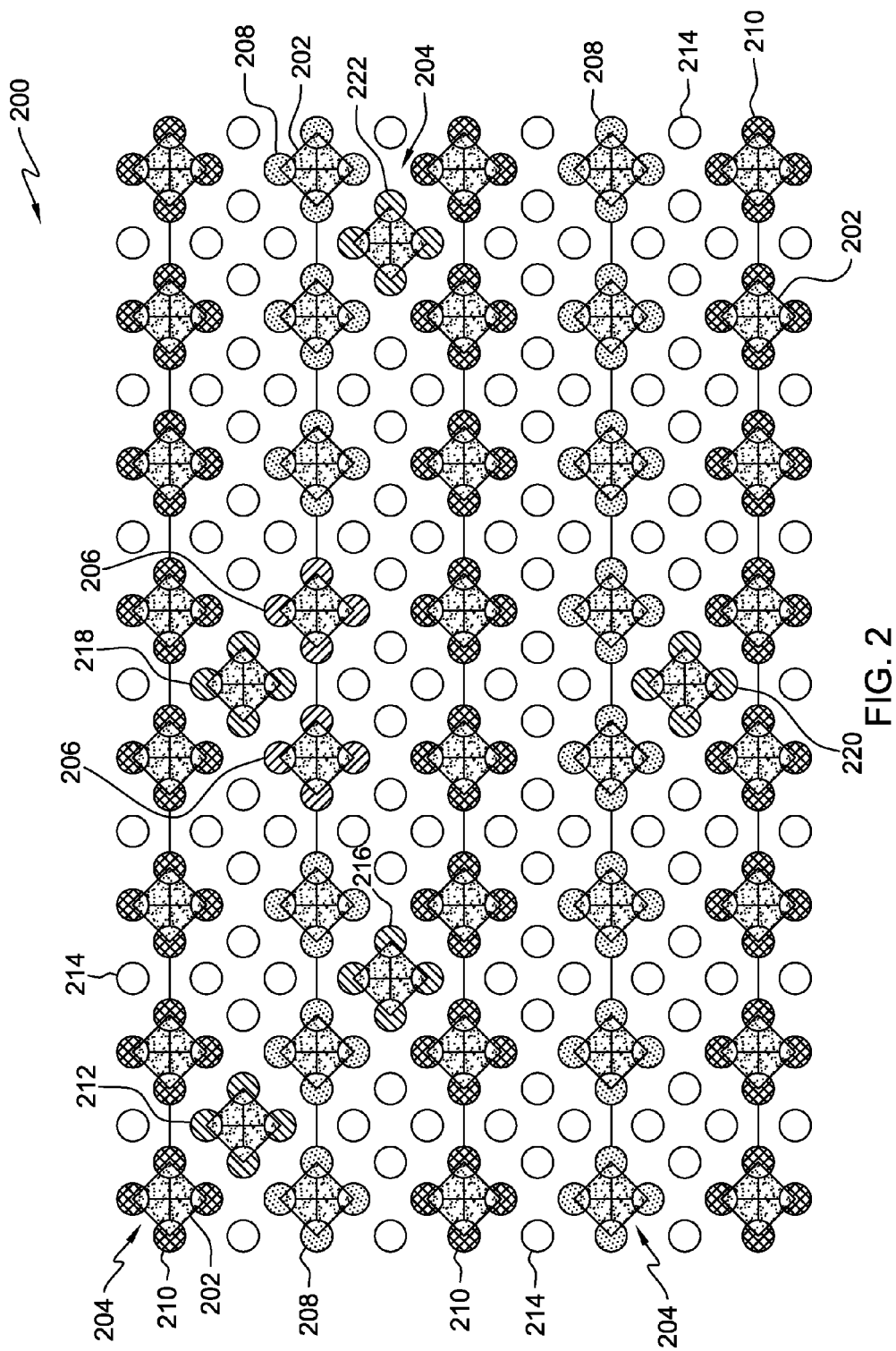
FIG. 2 is a plan view of a second semiconductor die layout according to the present invention.

FIG. 2 depicts a C4 array grid 200, or probing scheme, showing a mini C4 arrangement for 3D flip chip applications on a semiconductor die, or chip, according to an embodiment of the present invention. The C4 arrangement is based on groupings 204, or test clusters, of four C4s of a common type and/or ID. The C4s are grouped according to nine different I/O pad types and/or IDs including: C1 power 206; V2 power 208; ground 210; T1 data signal 212; single data signal 214 (the single data signal is a non-test signal, not to be connected during wafer test); T2 data signal 216; T3 data signal 218; T4 data signal 220; and T5 data signal 222. The illustrated arrangement places the four electrically common C4s of a test cluster on the array grid to form a rhombus shape for contact, in one embodiment, by a rhombus-shaped probe pin, shown as probe pin outline 202. T-series signal types, 216, 218, 220, and 222 are to be connected during wafer test for reduced pin count testing discussed above.

Single data signal pads 214 are not tested and may have unique data signal IDs. The single I/O pads are arranged on the same grid as other I/O pad types and have the same spacing, but without the need for redundancy.

Figure 3:
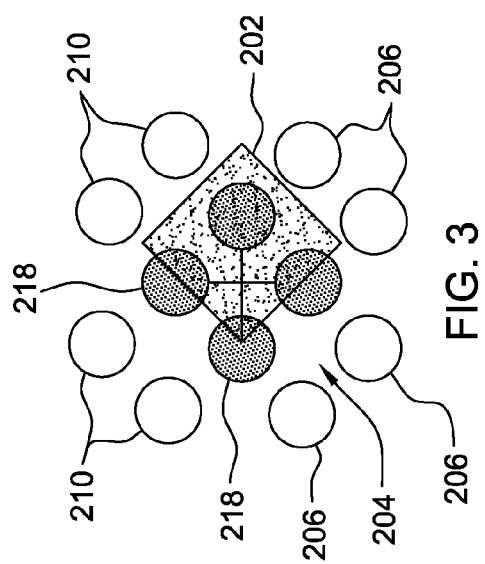
FIG. 3 is a detail view of a portion of the second semiconductor die layout of FIG. 2 and a superimposed cross-sectional view (cross hatching omitted for clarity of illustration purposes) of a first probe tip configuration according to the present invention.

FIG. 3 is a detailed view of a portion of the C4 array grid 200 of FIG. 2. A test cluster of four T3 signal C4s 218 are electrically connected on the chip to provide redundancy and to guarantee a good electrical contact in case of misaligned probe pin outline 202. The illustration shows how a misaligned probe pin maintains contact with the C4 cluster, but avoids contact with adjacent ground pads 210 and power pads 206. The illustrated tolerance for misalignment is large enough between cluster 204 and C4 pads of other types that there is much less risk of touching the ground pads and the power pads adjacent the test cluster than in the state of the art arrangement. In this way, the arrangement of mini C4s reduces the risk of causing signal and/or power shorts when running automatic wafer tests. The illustrated C4 arrangement guarantees that each data signal cluster has at least one adjacent power C4 and/or a ground C4 for shielding and return current requirements.

Figure 4:
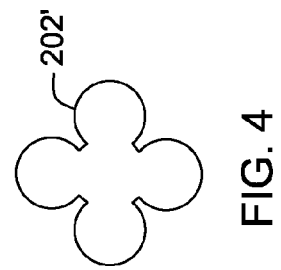
FIG. 4 is a cross-sectional view (cross hatching omitted for clarity of illustration purposes) of a second probe tip configuration according to the present invention.
Figure 5:
FIG. 5 is a perspective view of a portion of the second semiconductor die layout of FIG. 2 and a corresponding third probe tip configuration according to the present invention.

The probe pin is configured in a rhombus shape, matching the shape of test cluster 204 to take advantage of the redundancy of four contacts instead one. The probe pin shape can be optimized for contacting the clusters of C4s. For example, some embodiments of the probe pin have a more complex shape like clover leaf 202', as shown in FIG. 4. Another shape is an auto-centering convex lens structure 402 that will self-align upon contact with cluster 204 to contact one or more corresponding C4 208, as shown in FIG. 5.

Higher density next generation mini C4 grids may be arranged as shown in FIG. 2 to meet the requirements in high accuracy and small tolerance for probe-manufacturing and wafer prober equipment in a moderate, cost-effective way. That is, some embodiments of the present invention provide for similar registration tolerance in next generation, higher density, array grids as is currently provided in state-of-the-art layouts.

Some embodiments of the present invention combine two or more mini-C4s into a single, redundant test point. The disadvantage of requiring multiple mini-C4s for each test site applies only for the data signal IDs to be connected during testing. The high number of ground type pads 210 and power type pads 206, 208 is a desirable condition.

If there is a need to reduce the number of C4s or mini C4s per test cluster, or separately testable signal, to less than four, as shown in FIG. 2, the requirement for redundancy can be satisfied also with a common grouping of two or three consecutive C4s. Examples include: (i) three-pad test cluster 204' for contact by probe 402, shown in FIG. 6; and (ii) two-pad test cluster 130 for contact by probe 202", shown in FIGS. 7A and 7B.

Alternatively, where the number of C4s in a test cluster can exceed four, a separately testable signal may be made up of any number of I/O pads along with a corresponding probe shape that best fits the semiconductor die layout. For example, with reference to FIG. 1, a separately testable signal of 6 common contacts may be created with consecutively positioned I/O pads 102, 110, 116, 120, and 126. This 6-pad cluster may be tested with a centrally located bone-shaped probe.

Tighter tolerance is required for test probe alignment on 3D stacks having additional I/O pads in the array grid. In the 3D stack layout, there is a demand for as many interconnects, or data signal pads, as possible between the stacked chips. Some embodiments of the present invention recognize that chip technology will become increasingly less tolerant of the mechanical accuracy of the test probes.

Some embodiments of the present invention strike a balance between the probe tips making good electrical contact to the interconnects, or I/O pads, and avoiding making contact with neighboring interconnects, causing a short. One objective of the present invention is to get more tolerance for the test probes. In that way, as future developments require higher density interconnect array grid, testing the array will be readily achieved.

Some embodiments of the present invention group all of the I/O pads of a separately testable signal together so that a larger, single probe may be used to test the connection. Some embodiments of the present invention provide for each signal to be tested to have four pads connected together. There is a physical connection between the selected pads, for example, a piece of wire may be installed between the pads to create an electrical connection.

Some embodiments of the present invention recognize that wafer probe tests may require thousands of probe tips. Oftentimes, more than 200 kilograms of pressure is applied to form good connections with all these contact pads. When such high pressure is applied, a probe tip that is off center, even a small amount, will occasionally slip off of the C4 pad. Problems arising from such a situation include: (i) making unintentional contact with a dissimilar I/O pad; and/or (ii) making poor contact with the C4 ball due to variation in dimensions of the C4 ball. Unintentional contact may cause a short between two different data signal pads, or between a data signal pad and a power signal pad. A short may create a defective chip. Unintentional contact between a ground pad and a power pad destroys the probe test device, or probe card, if the contact is not detected and power is applied to the chip.

Figure 6:
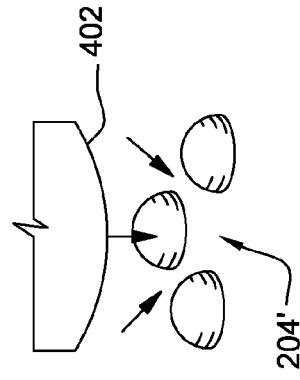
FIG. 6 is a partial perspective view of a third semiconductor die layout and a corresponding fourth probe tip configuration according to the present invention.

Some embodiments of the present invention take advantage of the mechanical dimensions of the proposed C4 arrangement. For example, a probe tip having a special shape, such as a convex lens will self-align within a group of consecutively positioned common I/O pads. If the accuracy of the probe pin is slightly off target, as the probe pin is pressed in-between the I/O pads, the probe pin self-aligns, or self-adjusts, to center itself in the middle of the test cluster. In the case of two-pad test cluster 130 including contacts 102a and 102b in FIGS. 7A and 7B, an alternative bone-shaped probe 202" will further increase available alignment tolerance. The bone-shaped probe tip is convex at opposing sides with a narrow central region. The convex pads of the probe make tangential contact with the ball structures to direct the probe tip between the two balls. A misaligned probe pad is self-aligned with the application of pressure during testing. Other examples of self-aligning probe/pad layout sets are shown in FIGS. 5 and 6.

The arrangement of C4s as shown in FIG. 2, where test clusters are consecutively positioned with power pads and/or ground pads, has two purposes: (i) shielding, or noise immunity; and (ii) return current. Noise immunity is improved where the data signal pads are in-between ground and/or power pads. By having the test clusters close to ground pads and/or power pads, the return currents have a continuous impedance value. For example, in a 50 Ohm environment (a transmission line environment) with the illustrated arrangement, an environment as close as possible to a continuous 50-ohm environment is achieved, even through the C4 pads.

In some embodiments of the present invention, the two C4 pads in a cluster are not required to be diagonally adjacent on the ball grid array, but any consecutive positions may form a test cluster. Similarly, the three- and four-pad groups are not required to be placed in rhombus-like relationship with each other. For example, a regular rectangular array grid may include four mutually adjacent C4 pads that are electrically common, such that a single probe contacts one or more of the four C4s during testing. It should be noted that any number of I/O pads having consecutive positions relative to at least one other I/O pad of the same identity may be electrically common to form a test cluster.

Figure 8:
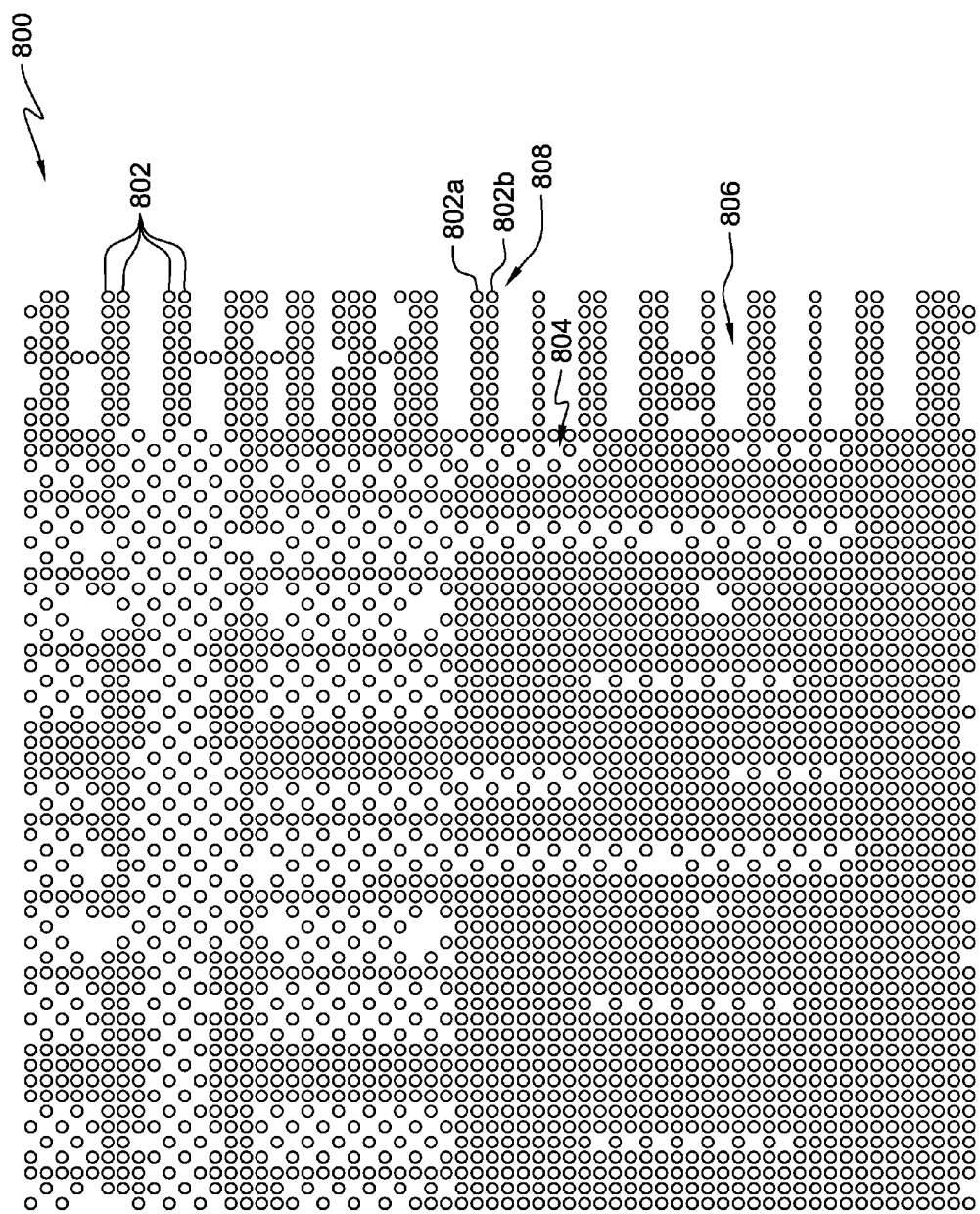
FIG. 8 is a plan view of a third semiconductor die layout according to the present invention.

FIG. 8 shows die array 800 including: many I/O contacts 802 (such as two-contact cluster 808, including contacts 802a and 802b); single empty spaces 804; and empty space clusters 806. In some portions of array 800, the contacts take on the form of a closely spaced regular rectangular array. In other portions, the contacts take the form of a less-closely-spaced staggered array. In either portion, there may be contacts missing from certain array positions where a contact could be. In the staggered portion, there may be relatively few and relatively spatially isolated additional contacts that fall between positions defined by the staggered array. However, neither "missing" nor "additional" contacts should be deemed to neither: (i) render the rectangular array portion as something other than a rectangular array; nor (ii) render the rectangular array portion as something other than a staggered array. It is true that too many missing and/or additional contacts make it impossible to classify a semiconductor array surface (or portion thereof) as an "array," but this document will not attempt to define this boundary between "arrays" and "arbitrary arrangements of contacts" with any mathematical precision—alternative requirements may govern specific implementations whether an array is present on the die (or portion thereof) and what type of array it is. Whether contacts are in "consecutive" positions for purposes of determining adjacency (see definition, below) should be made without regard to additional and/or missing contacts.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: non-exclusive or; for example, A and/or B means that: (i) A is true and B is false; or (ii) A is false and B is true; or (iii) A and B are both true.

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as a mechanical connection that allows for relative motion between the mechanically connected components; includes, but is not limited to, welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Staggered array: any array of objects formed by superimposing a second regular rectangular array on a first rectangular array to form a staggered array where: (i) columns from the second array are parallel to columns of the first array, (ii) columns of the second array are each respectively in between columns of the first array, (iii) non-terminal rows of the second array are parallel to rows of the first array, and (iv) non-terminal rows of the second array are each respectively in between rows of the first array; usually the first and second arrays will have equal pitch values, but this is not necessarily an absolute requirement; usually the rows and columns of the second array will be halfway between rows and columns, respectively, of the first array, but this is not necessarily an absolute requirement.

Adjacent: when two items in a regular rectangular, or staggered, array are in: (i) consecutive positions in the same row, (ii) consecutive positions in the same column, or (iii) in both of a consecutive row and a consecutive column.

What is claimed is:

1. A semiconductor die comprising:
   a substrate; and
   a plurality of input/output (I/O) pads arranged in an array defining a plurality of parallel rows and a plurality of parallel columns;
   wherein:
   the plurality of I/O pads includes: a first plurality of cluster pads forming a first test cluster, a first set of ground pads, and a first set of power pads;
   the first plurality of cluster pads of the first test cluster are all adjacent to at least one other pad in the first test cluster;
   the first plurality of cluster pads of the first test cluster all have the same data signal, at least during testing operations; and
   each cluster pad of the first plurality of cluster pads is in a consecutive position with respect to at least one of a ground pad or a power pad, the consecutive position relative to either a row of I/O pads or a column of I/O pads.

2. The semiconductor die of claim 1 further comprising: a second plurality of cluster pads forming a second test cluster.

3. The semiconductor die of claim 1 wherein the first test cluster comprises two or more connected data signal pads.

4. The semiconductor die of claim 3 wherein the two or more connected data signal pads are directly electrically connected to each other.

5. The semiconductor die of claim 3 wherein the two or more connected data signal pads are connected to each other by a current path.

6. The semiconductor die of claim 1 further comprising a plurality of sets of cluster pads forming a plurality of test clusters.

7. The semiconductor die of claim 1 wherein the first plurality of cluster pads comprises a staggered array of signal pads comprising a first plurality of signal pads arranged in a first array and a second plurality of signal pads arranged in a second array.

* * * * *